(12) United States Patent  
Nishimura et al.

(10) Patent No.: US 11,776,839 B2  
(45) Date of Patent: Oct. 3, 2023

(54) SUBSTRATE HOLDING DEVICE

(71) Applicant: NISSIN ION EQUIPMENT CO., LTD., Koka (JP)

(72) Inventors: Ippei Nishimura, Koka (JP); Masatoshi Onoda, Koka (JP)

(73) Assignee: NISSIN ION EQUIPMENT CO., LTD., Koka (JP)

(*) Notice: Subject to any disclaimer, the term of this patent is extended or adjusted under 35 U.S.C. 154(b) by 877 days.

(21) Appl. No.: 16/548,959

(22) Filed: Aug. 23, 2019

(65) Prior Publication Data

US 2020/0211891 A1    Jul. 2, 2020

(30) Foreign Application Priority Data

Dec. 27, 2018  (JP) ................................ 2018-244238

(51) Int. Cl.
| | |
|---|---|
| *H01L 21/687* | (2006.01) |
| *H01L 21/683* | (2006.01) |
| *H01J 37/20* | (2006.01) |
| *H01J 37/317* | (2006.01) |

(52) U.S. Cl.
CPC ........ *H01L 21/68742* (2013.01); *H01J 37/20* (2013.01); *H01L 21/6833* (2013.01); *H01L 21/68764* (2013.01); *H01J 37/3171* (2013.01); *H01J 2237/20235* (2013.01)

(58) Field of Classification Search
None
See application file for complete search history.

(56) References Cited

U.S. PATENT DOCUMENTS

| | | | | |
|---|---|---|---|---|
| 2005/0076531 | A1* | 4/2005 | Smith | H01L 21/68728 34/313 |
| 2010/0083986 | A1* | 4/2010 | Kamikawa | H01L 21/68792 134/26 |
| 2010/0265631 | A1 | 10/2010 | Stone et al. | |
| 2013/0220551 | A1* | 8/2013 | Saito | C23C 16/458 156/345.55 |
| 2017/0133260 | A1* | 5/2017 | Pohl | H01L 21/68742 |

FOREIGN PATENT DOCUMENTS

| | | |
|---|---|---|
| JP | 2002-164423 A | 6/2002 |
| JP | 2012-524417 A | 10/2012 |
| KR | 0150988 B1 | 12/1998 |
| KR | 10-2008-0060684 A | 7/2008 |

\* cited by examiner

*Primary Examiner* — Jeffrie R Lund  
*Assistant Examiner* — Tiffany Z Nuckols  
(74) *Attorney, Agent, or Firm* — Sughrue Mion, PLLC

(57) ABSTRACT

A substrate holding device is provided. The substrate holding device includes a substrate holder, a shaft attached to the substrate holder, a motor attached to the shaft, lifting pins, and a transmission assembly. The lifting pins are movable between a retracted position below a surface of the substrate holder, and a protruded position protruding from the surface. The transmission assembly is provided between the shaft and lifting pins and switches the substrate holding device between a transmittable state in which a driving force from the motor is transmitted to the lifting pins to move the lifting pins between the retracted position and the protruded position, and a non-transmittable state in which the driving force from the motor is not transmitted to the lifting pins but rotates the substrate holder.

7 Claims, 10 Drawing Sheets

SUBSTRATE HOLDING DEVICE

CROSS-REFERENCE TO RELATED APPLICATIONS

This application claims priority from Japanese Patent Application No. 2018-244238 filed on Dec. 27, 2018, in the Japanese Patent Office, the entire contents of which is herein incorporated by reference in its entirety.

BACKGROUND

1. Field

The present disclosure relates to a substrate holding device for use in an ion beam irradiation apparatus or the like.

2. Description of Related Art

A related art substrate holding device employs a mechanism to lift a substrate from a substrate holder. See, e.g., JP 2012-524417A.

However, the related art substrate holding device includes a dedicated driving source such as an electric motor to lift the substrate upward, and therefore a size of the related art substrate holding device increases.

SUMMARY

It is an aspect to provide a substrate holding device capable of lifting a substrate from a substrate holder without causing an increase in size of the entire device.

According to an aspect of one or more embodiments, there is provided a substrate holding device comprising a substrate holder; a rotation mechanism that rotates the substrate holder; a plurality of lifting pins configured to be moved between a retracted position below a surface of the substrate holder, and a protruded position protruding from the surface; and a driving force transmission assembly interposed between the rotation mechanism and the plurality of lifting pins that converts a driving force for rotating the substrate holder, into a driving force for moving the plurality of lifting pins between the retracted position and the protruded position, and transmits the converted driving force to the plurality of lifting pins.

According to another aspect of one or more embodiments, there is provided a substrate holder; a shaft attached to the substrate holder; a motor attached to the shaft; a plurality of lifting pins moveable between a retracted position below a surface of the substrate holder, and a protruded position protruding from the surface; and a transmission assembly provided between the shaft and the plurality of lifting pins that switches the substrate holding device between a transmittable state in which a driving force from the motor is transmitted to the lifting pins to move the lifting pins between the retracted position and the protruded position, and a non-transmittable state in which the driving force from the motor is not transmitted to the lifting pins but rotates the substrate holder.

DETAILED DESCRIPTION

Figure 1:
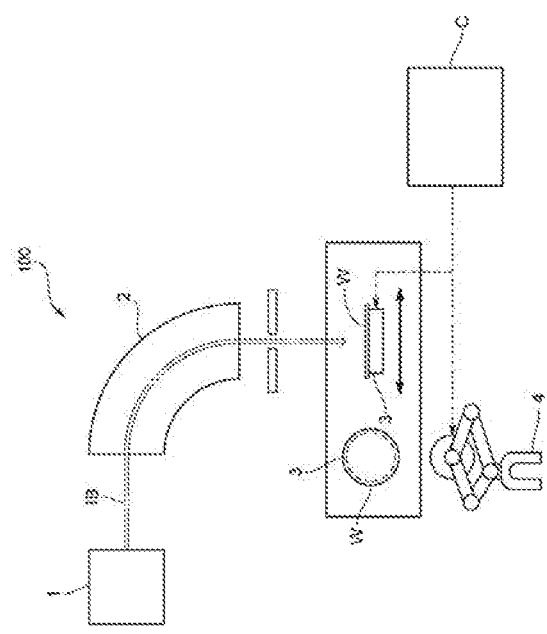
FIG. 1 is a schematic diagram showing an overall configuration of an ion beam irradiation apparatus according to an embodiment.

In some embodiments, a substrate holding device may include a substrate holder for holding a substrate, a rotation mechanism for rotating the substrate holder, a plurality of lifting pins, and a driving force transmission assembly. The pins are each configured to be moved up and down between a retracted position where the pins are located below a substrate loading surface of the substrate holder, and a protruded position where the pins are located to protrude from the substrate loading surface. The driving force transmission assembly is interposed between the rotation mechanism and the plurality of lifting pins and configured to convert a driving force for rotating the substrate holder into a driving force for moving the plurality of lifting pins between the retracted position and the protruded position, and transmit the converted driving force to the plurality of lifting pins.

In the substrate holding device according to various embodiments disclosed herein, the driving force for operating the rotation mechanism, e.g., a driving force for operating an existing rotation mechanism to adjust a twist angle or the like, may be converted into the driving force for moving the plurality of lifting pins, through the driving force transmission assembly.

This makes it possible to eliminate the need for a dedicated driving source such as an electric motor for moving the plurality of lifting pins, and thus lift the substrate from the substrate holder without causing an increase in size of the entire device.

In some embodiments, the driving force transmission assembly may include an integrally rotatable member attached to the substrate holder and rotatable together with the substrate holder, a relatively rotatable member relatively rotatable with respect to the integrally rotatable member, about a rotational axis of the integrally rotatable member, an oblique groove provided in one of the integrally rotatable member and the relatively rotatable member, and a slider provided on the other of the integrally rotatable member and the relatively rotatable member in such a manner as to be slidable along the oblique groove, and provided integrally with the plurality of lifting pins.

According to the driving force transmission assembly, the slider which is slidable along the inside of the oblique groove is provided integrally with the plurality of lifting pins. Thus, by incorporating the driving force transmission assembly, it becomes possible to easily convert the driving force for operating the rotation mechanism into the driving force for moving the plurality of lifting pins, and transmit the converted driving force to the plurality of lifting pins.

In some embodiments, the substrate holder may be configured to be movable between a lying posture and a standing posture, and the substrate holding device may further include a transmission state switch configured to switch between a transmittable state capable of enabling the driving force transmission to the plurality of lifting pins by the driving force transmission assembly, and a non-transmittable state capable of disabling the driving force transmission to the plurality of lifting pins by the driving force transmission assembly. The transmission state switch may be operable, when the substrate holder is moved from the lying posture to the standing posture, to switch from the transmittable state to the non-transmittable state, and when the substrate holder is moved from the standing posture to the lying posture, to switch from the non-transmittable state to the transmittable state.

According to the transmission state switch, when separating the substrate from the substrate holder, it is possible to enable the driving force transmission to the plurality of lifting pins by the driving force transmission assembly, and, when subjecting the substrate to treatment such as irradiation with an ion beam, it is possible to perform the substrate treatment in the same manner as ever, without transmitting the driving force to the plurality of lifting pins.

The substrate holding device according to various embodiments can lift the substrate from the substrate holder without causing an increase in size of the entire device.

Hereinbelow, various embodiments of a substrate holding device will be described with reference to the drawings. The substrate holding device may be used in, e.g., an ion beam irradiation apparatus such as an ion implantation apparatus, and is designed to hold a substrate in a desired posture during each of various stages such as during ion beam irradiation.

An overall configuration of an ion beam irradiation apparatus will be briefly described. FIG. 1 is a schematic diagram showing an overall configuration of an ion beam irradiation apparatus according to an embodiment As shown in FIG. 1, an ion beam irradiation apparatus 100 is designed to subject an ion beam IB extracted from an ion source 1 to mass analysis using a mass analyzer 2, and then irradiate, with the resulting ion beam, a substrate W held by a substrate holder 3, also referred to as a "platen", to implant desired ion species into the substrate W.

More specifically, the ion beam irradiation apparatus 100 is configured to operate a transfer arm 4 to transfer the substrate W to a position just above the substrate holder 3 and place or load the substrate W on the substrate holder 3, and, after holding the substrate W in place on the substrate holder 3 by an electrostatic chuck or the like, irradiate the substrate W with the ion beam IB, while the substrate holder 3 is scanningly moved, as shown by the arrow in FIG. 1. In the embodiment of FIG. 1, the substrate W has a size greater than an upper surface, i.e., substrate loading surface, of the substrate holder 3. For example, the substrate W may be a semiconductor wafer such as a silicon wafer. For the sake of easy understanding, FIG. 1 illustrates on the left hand side a state just after the substrate W is loaded on the substrate holder 3, and on the right hand side a state in which the substrate W is being irradiated with the ion beam IB. In the embodiment shown in FIG. 1, a scanning movement direction of the substrate holder 3 is a horizontal direction as shown by the arrows. However, this is only an example and a scanning movement direction may alternatively be a vertical direction. The substrate holder 3 and the transfer arm 4 may be controlled by a controller C.

Figure 2:
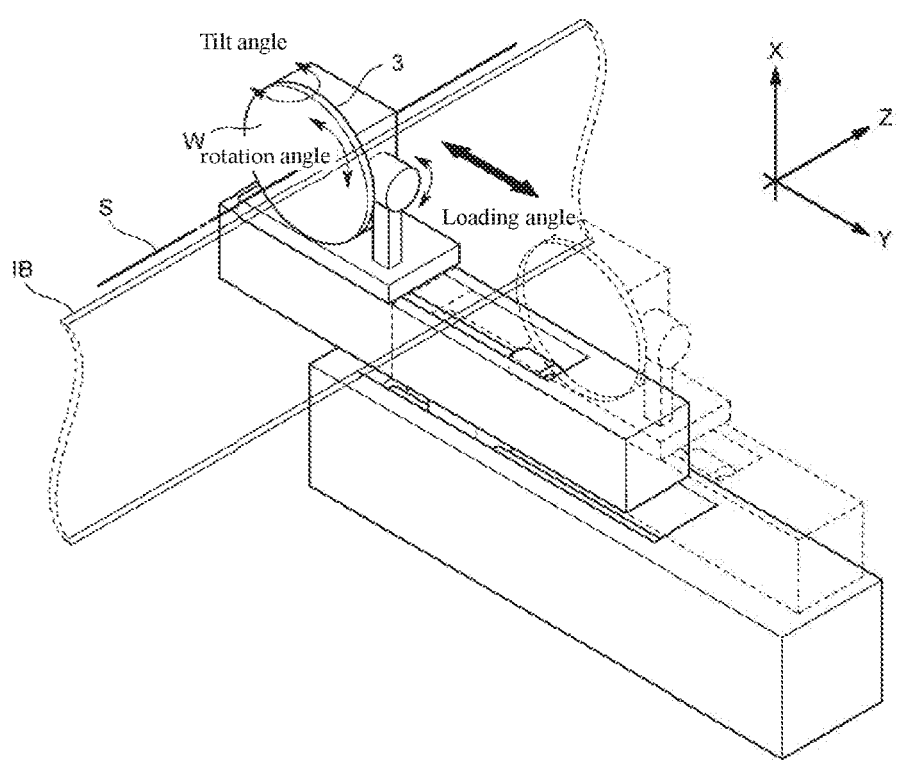
FIG. 2 is a schematic diagram showing movements of a substrate holder in a substrate holding device of the ion beam irradiation apparatus of FIG. 1, according to an embodiment.

FIG. 2 is a schematic diagram showing movements of a substrate holder in a substrate holding device of the ion beam irradiation apparatus of FIG. 1, according to an embodiment.

As shown in FIG. 2, the ion beam irradiation apparatus 100 is configured to enable the substrate holder 3 to be rotated about each of a plurality of axes.

Specifically, as a first rotation mechanism, the ion beam irradiation apparatus 100 is provided with a loading angle adjustment mechanism for rotating the substrate holder 3 about a first axis along the scanning movement direction of the substrate holder 3 (i.e., rotating the substrate holder 3 about a Y axis in FIG. 2). The loading angle adjustment mechanism is configured to turn the substrate holder 3 between a lying posture and a standing posture. It should be noted that FIG. 2 shows a standing posture. The lying posture means the posture that the substrate holder 3 has when the substrate W is loaded or the loaded substrate W is lifted. For example, the lying posture is a horizontal posture in parallel with the Y-Z plane in FIG. 2. The standing posture means the posture of that substrate holder 3 has when the substrate W is irradiated with the ion beam IB. For example, the standing posture is a vertical posture in parallel with the X-Y plane in FIG. 2.

As a second rotation mechanism, the ion beam irradiation apparatus 100 is also provided with a rotation angle adjustment mechanism for rotating the substrate holder 3 about a second axis orthogonal to a surface of the substrate holder 3 (i.e., rotating the substrate holder 3 about a Z axis in FIG. 2). The rotation angle adjustment mechanism is provided as a means to set an angle between a crystal axis of the substrate and an irradiation direction of the ion beam to a given value, and is configured to rotate the substrate holder 3 in the standing posture when the substrate is located at an ion beam non-irradiation position.

As a third rotation mechanism, the ion beam irradiation apparatus 100 is further provided with a tilt angle adjustment mechanism for rotating the substrate holder 3 about a third axis orthogonal to the second axis of the rotation angle adjustment mechanism and orthogonal to the first axis of the loading angle adjustment mechanism (i.e., rotating the substrate holder about an X axis in FIG. 2).

Figure 3:
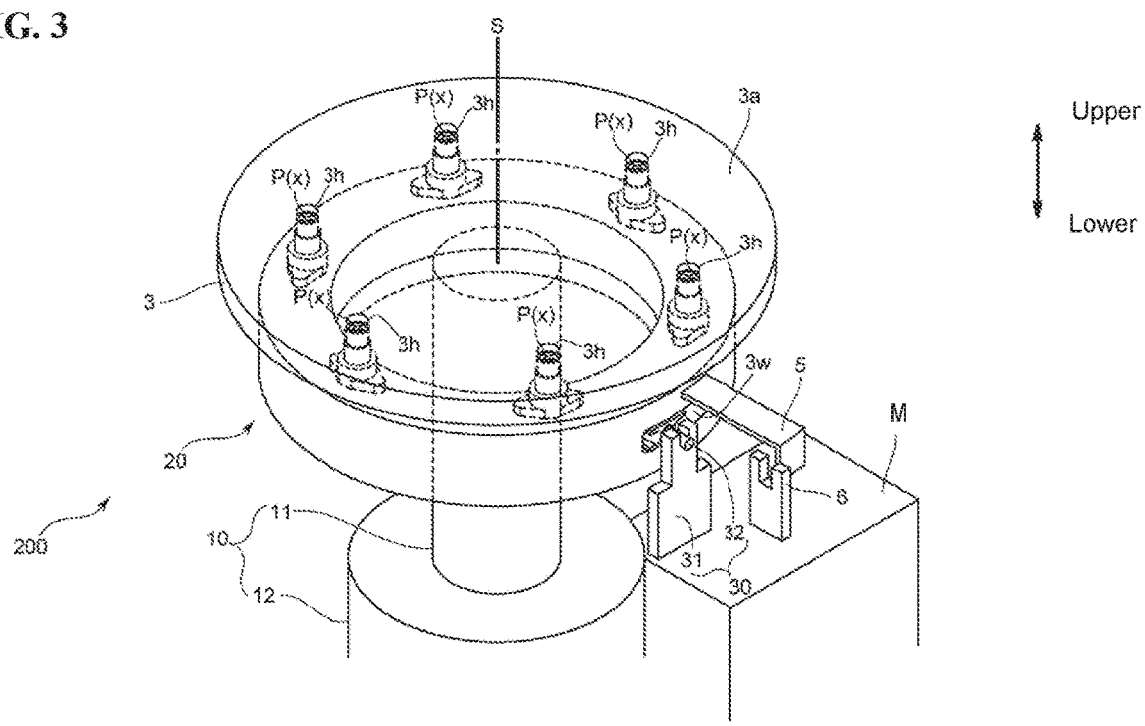
FIG. 3 is a schematic diagram showing lifting pins in a retracted position in the substrate holding device of FIG. 2, according to an embodiment.
Figure 4:
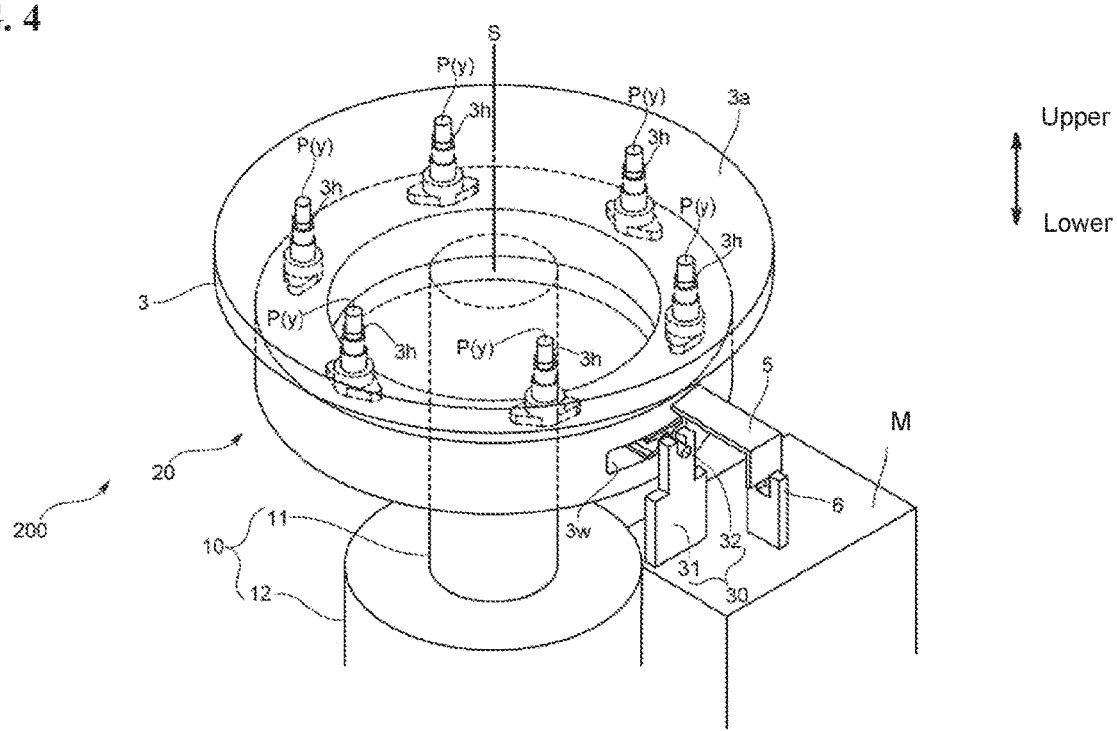
FIG. 4 is a schematic diagram showing the lifting pins in a protruded position the substrate holding device of FIG. 2, according to an embodiment.

Next, the substrate holding device 200 will be described with reference to FIGS. 3 and 4. FIG. 3 is a schematic diagram showing lifting pins in a retracted position in the substrate holding device of FIG. 2, according to an embodiment. FIG. 4 is a schematic diagram showing the lifting pins in a protruded position the substrate holding device of FIG. 2, according to an embodiment. For the sake of easy understanding, the following description will be made assuming that a surface 3*a* of the substrate holder 3 in the lying posture is defined as an upper side, and the opposite side is defined as a lower side, as shown in FIGS. 3 and 4. It should be noted that FIGS. 3 and 4 show the substrate holder 3 in a lying posture.

As shown in FIGS. 3 and 4, the substrate holding device 200 comprises the substrate holder 3, a rotation mechanism 10, and a plurality of lifting pins P. The rotation mechanism 10 rotates the substrate holder 3 about an axis S which is orthogonal to the surface 3a of the substrate holder 3. The plurality of lifting pins P are each configured to be moved up and down through a respective one of a plurality of through-holes 3h formed in the substrate holder 3. It should be noted here that the substrate W is not illustrated in FIGS. 3 and 4 for the sake of easy understanding.

As shown in FIGS. 3 and 4, the rotation mechanism 10 comprises a shaft 11 connected to the substrate holder 3, and an electric motor 12 which is a driving source connected to the shaft 11 and which rotates the shaft 11. The rotation mechanism 10 corresponds to an existing mechanism for rotating the substrate holder 3 about the axis S orthogonal to the surface 3a of the substrate holder 3. In the embodiment shown in FIG. 3, the rotation mechanism 10 includes the aforementioned rotation angle adjustment mechanism as the second rotation mechanism. That is, the electric motor 12 which is a driving source of the rotation angle adjustment mechanism is used as the driving source of the substrate holding device 200.

As shown in FIGS. 3 and 4, each of the lifting pins P is formed in a rod shape to lift the substrate W from the substrate holder 3, and configured to be moved up and down between a retracted position P(x) where the lifting pin is located below the surface 3a of the substrate holder 3 (the position of the lifting pin P illustrated in FIG. 3), and a protruded position P(y) where the lifting pin is located to protrude upwardly from the surface 3a of the substrate holder 3 (the position of the lifting pin P illustrated in FIG. 4). More specifically, at the retracted positon x, an upper end of each of the lifting pins P is located below the surface 3a of the substrate holder 3, i.e., is retracted inside a corresponding one of though-holes 3h formed in the substrate holder 3. On the other hand, at the protruded positon y, the upper end of each of the lifting pins P is located above the surface 3a of the substrate holder 3. In the embodiment shown in FIGS. 3 and 4, the lifting pins P are arranged on the circumference of a circle having a center on the rotational axis of the rotation mechanism 10, at even intervals. However, the number and arrangement of the lifting pins P are not limited to the illustrated example, but may be appropriately changed.

As shown in FIGS. 3 and 4, the substrate holding device 200 further comprises a driving force transmission assembly 20 interposed between the rotation mechanism 10 and the plurality of lifting pins P, and a transmission state switch 30 for switching a driving force transmission state.

The driving force transmission assembly 20 is configured to convert a first driving force for operating the rotation mechanism 10 to rotate the substrate holder 3, into a second driving force for moving the plurality of lifting pins P between the retracted position x and the protruded position y, and transmit the converted driving force to the plurality of lifting pins P. As shown in FIGS. 3 and 4, the driving force transmission assembly 20 is formed in an annular shape and attached to the substrate holder 3 on the side opposite to the surface 3a, i.e., to the lower side of the substrate holder 3, such that the aforementioned shaft 11 penetrates therethrough.

Figure 5:
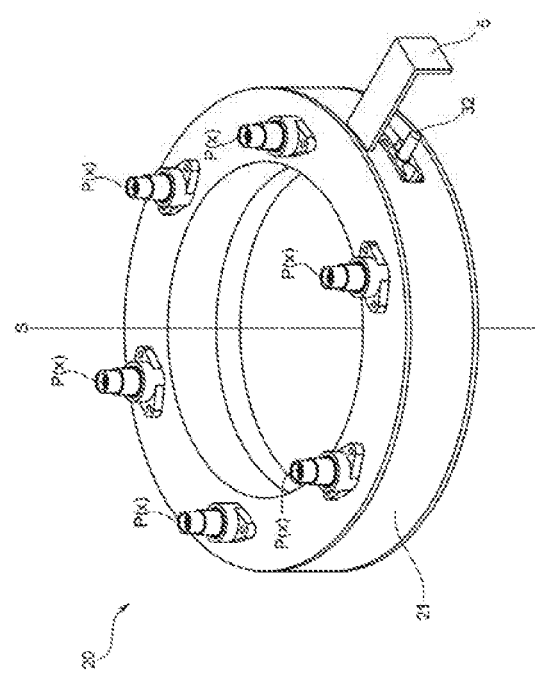
FIG. 5 is a schematic diagram showing an external appearance of a driving force transmission assembly in the substrate holding device of FIG. 2, according to an embodiment.
Figure 6:
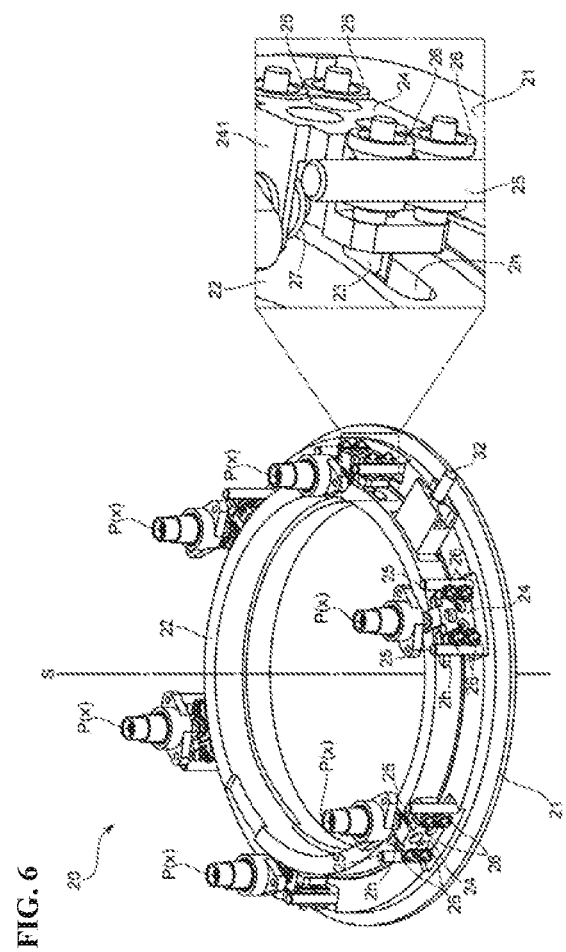
FIG. 6 is a schematic diagram showing an internal structure of the driving force transmission assembly, according to an embodiment.

FIG. 5 is a schematic diagram showing an external appearance of a driving force transmission assembly in the substrate holding device of FIG. 2, according to an embodiment, and FIG. 6 is a schematic diagram showing an internal structure of the driving force transmission assembly, according to an embodiment.

More specifically, as shown in FIGS. 5 and 6, the driving force transmission assembly 20 comprises an annular-shaped integrally rotatable member 21 attached to the substrate holder 3 and rotatable together with the substrate holder 3, and an annular-shaped relatively rotatable member 22 provided inward of the integrally rotatable member 21 and rotatable relative to the integrally rotatable member 21, about the rotational axis S of the integrally rotatable member 21. That is, the integrally rotatable member 21 and the relatively rotatable member 22 are arranged such that rotational axes thereof are coaxial. In some embodiments, the annular-shaped integrally rotatable member 21 may be considered a first annular member, and the annular-shaped relatively rotatably member 22 may be considered a second annular member. It should be noted here that, in FIG. 6, illustration of a part (peripheral and upper walls) of the integrally rotatable member 21 is omitted for the sake of illustration.

Figure 8:
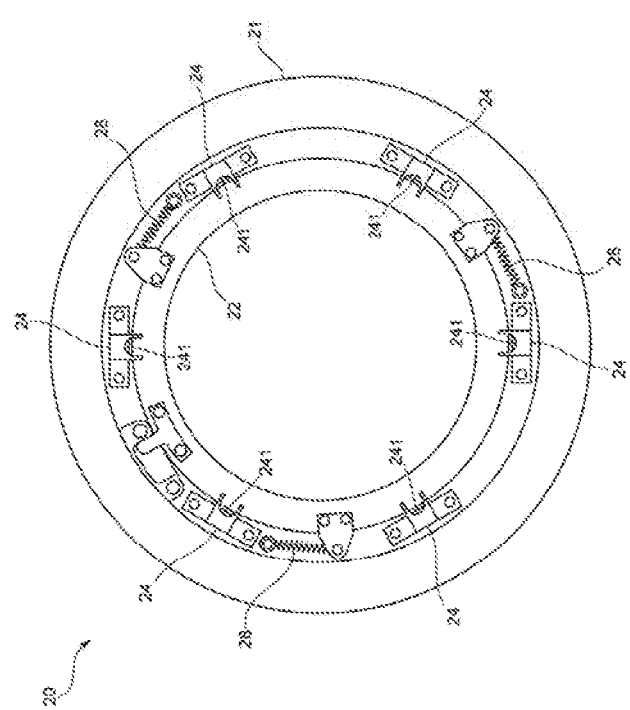
FIG. 8 is a schematic diagram showing a biasing member of the driving force transmission assembly, according to an embodiment.

FIG. 8 is a schematic diagram showing a biasing member of the driving force transmission assembly.

As shown in FIG. 8, the integrally rotatable member 21 and the relatively rotatable member 22 are configured such that the integrally rotatable member 21 and the relatively rotatable member 22 are coupled together by biasing members 28, so as to allow the relatively rotatable member 22 to be relatively rotated with respect to the integrally rotatable member 21. In some embodiments, the biasing members 28 may be one or more springs, or the like.

The integrally rotatable member 21 is attached to the substrate holder 3, so that, when a driving force from the rotation mechanism 10 is applied to the substrate holder 3, the integrally rotatable member 21 is rotated integrally with the substrate holder 3. That is, the integrally rotatable member 21 is rotated interlockingly with a rotational movement of the shaft 11.

By contrast, the relatively rotatable member 22 is coupled to the integrally rotatable member 21 while being biased by the biasing member 28 such that the relatively rotatable member 22 and the integrally rotatable member 21 pull against each other (i.e., such that the integrally rotatable member 21 and the relatively rotatable member 22 are rotated, respectively, in opposite directions). Thus, when the transmission state switch 30 is switched to a non-transmittable state B, the relatively rotatable member 22 may be rotated together with the integrally rotatable member 21 coaxially about the axis S.

On the other hand, when the transmission state switch 30 is switched to a transmittable state A, the rotation of the relatively rotatable member 22 is disabled by a stopper 31. Thus, when a driving force received from the driving source 10 by the integrally rotatable member 21 becomes greater than a biasing force of the biasing member 28, the integrally rotatable member 21 starts rotating, and, when the driving force received from the driving source 10 by the integrally rotatable member 21 becomes balanced with the biasing force of the biasing member 28, the integrally rotatable member 21 is stopped at that position.

Returning to FIG. 6, the driving force transmission assembly 20 further comprises an oblique groove 2h provided in one of the integrally rotatable member 21 and the relatively rotatable member 22, and a slider 23 provided on the other of the integrally rotatable member 21 and the relatively rotatable member 22 in such a manner as to be slidable along the inside of the oblique groove 2h. In the embodiment shown in FIG. 6, the oblique groove 2h is formed in the relatively rotatable member 22, and the slider 23 is provided on a support body 24.

Figure 7:
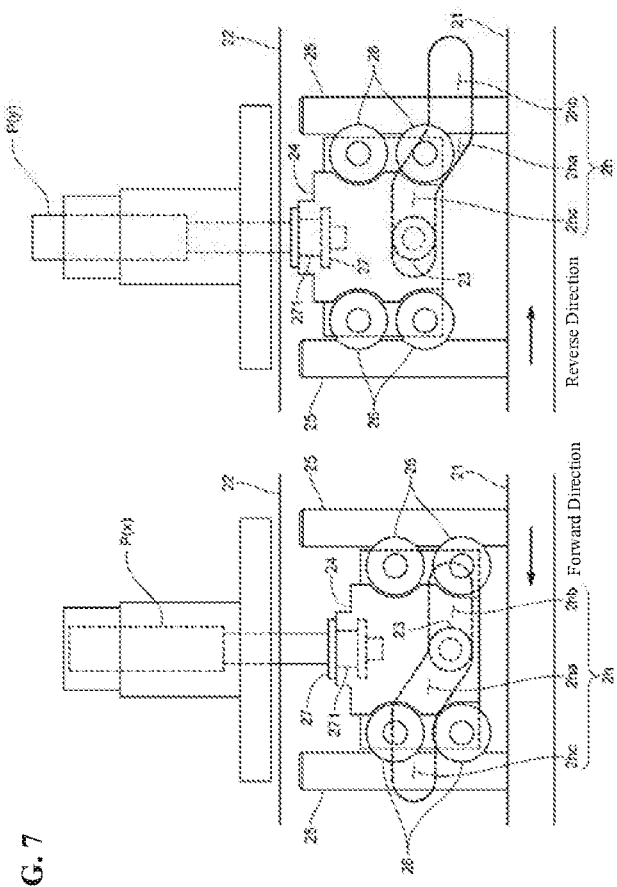
FIG. 7 is a schematic diagram showing an operation of the driving force transmission assembly, according to an embodiment.

FIG. 7 is a schematic diagram showing an operation of the driving force transmission assembly.

As shown in FIG. 7, the oblique groove 2h is formed in an outer peripheral surface of the relatively rotatable member 22, and comprises an inclined portion 2ha extending obliquely with respect to a circumferential direction of the relatively rotatable member 22; a first horizontal end portion 2hb extending along the circumferential direction from one end (lower end) of the inclined portion 2ha; and a second horizontal end portion 2hc extending along the circumferential direction from the other end (upper end) of the inclined portion 2ha in a direction opposite to the first horizontal end portion 2hb.

In the embodiment shown in FIG. 6, the oblique groove 2h is provided plurally along the circumferential direction of the relatively rotatable member 22 at even intervals. More specifically, the number of the oblique grooves 2h may be equal to the number of lifting pins P, such that one oblique groove 2h is provided for one lifting pin P. In the example shown in FIG. 6, six oblique grooves 2h are provided for the six lifting pins and the six oblique grooves 2h are arranged along the circumference of the relatively rotatable member 22 at even intervals. However, this is only an example, and the number and arrangement of the oblique grooves 2h are not limited to the illustrated example, but may be appropriately changed.

Further, the oblique groove 2h is not limited to a sectionally concave shape, but may have any shape a part of or an entirety of which penetrates between outer and inner peripheral surfaces of one of the integrally rotatable member 21 and the relatively rotatable member 22. In other words, the shape of the oblique groove 2h does not need to follow the curvature of the relatively rotatable member 22.

As shown in the enlarged view in FIG. 6 and FIG. 7, the slider 23 is a rod-shaped member which is disposed to extend radially inwardly from a support body 24 into the oblique groove 2h and provided to be slidable along the inside of the oblique groove 2h. Specifically, as shown in the embodiment depicted in FIG. 6, the slider 23 has one end provided inside the oblique groove 2h and the other end supported by the support body 24 which is movable along a pair of guide members 25 provided on the sides of the support body 24 and attached to the integrally rotatable member 21.

The integrally rotatable member 21 and the relatively rotatable member 22 are rotatable relative to each other about the common axis S, so that the oblique grooves 2h and the slider 23 are also rotatable relative to each other about the common axis S. Thus, respective rotational trajectories of the oblique groove 2h and the slider 23 disposed inside the oblique groove 2h are coincident with each other, so that the slider 23 remains engaged in the oblique groove 2h even if the integrally rotatable member 21 and the relatively rotatable member 22 are rotated relative to each other in any manner.

As shown in FIGS. 6 and 7, two guide members 25 for guiding the support body 24 up and down are provided, one on each side of the support body 24 in the circumferential direction. In the embodiment depicted in FIG. 6, the guide members 25 are attached to the integrally rotatable member 21. A plurality of guide rollers 26 are provided between the support body 24 and each of the guide members 25 so that the guide rollers 26 may roll along the guide member 25 while supporting the support body 24. The guide members 25 and the guide rollers 26 need not necessarily be provided on each side of the support body 24 as shown in the example of FIG. 6, but in some embodiments, alternatively may be provided on only one side of the support body 24 in the circumferential direction. Further, the example shown in FIG. 6 illustrates two guide rollers 26 on each side of the support body 24. However, this is only an example, and the number of the guide rollers 26 may be appropriately changed.

As shown in FIGS. 6 and 7, a support body 24 is engaged to each of the lifting pins P such that the lifting pin P is integrally moved up and down. Specifically, the support body 24 is engaged to the lifting pin P by hooking a hook portion 241 provided on an upper section of the support body 24 (most clearly shown in FIG. 8) with a constricted portion 271 of a cylindrical body 27 attached to the lifting pin P as illustrated in FIG. 7. The attachment structure between the support body 24 and the lifting pin P may be appropriately changed. In some embodiments, the support body 24 may be connected to the lifting pin P. For example, the lifting pin P may be threaded into the support body 24.

Based on the above configuration, when the integrally rotatable member 21 is rotated with respect to the relatively rotatable member 22 in a forward direction (i.e., a clockwise direction when the driving force transmission assembly 20 is viewed from above in FIGS. 3 to 6; see also FIG. 7), the slider 23 is moved from the first horizontal end portion 2hb to ascend the inclined portion 2ha and reach the second horizontal end portion 2hc. Since the slider 23 is supported by the support body 24, which may roll along the guide members 25 the lifting pin P engaged to the support body 24 is moved upwardly from the retracted position x to the protruded position y along with the movement of the slider 23, as shown in FIG. 7.

On the other hand, when the integrally rotatable member 21 is rotated with respect to the relatively rotatable member 22 in a reverse direction (i.e., a counterclockwise direction when the driving force transmission assembly 20 is viewed from above in FIGS. 3 to 6; see also FIG. 7), the slider 23 is moved from the second horizontal end portion 2hc to descend the inclined portion 2ha and reach the first horizontal end portion 2hb. Since the slider 23 is supported by the support body 24, which may roll along the guide members 25, the lifting pin P engaged to the support body 24 is moved downwardly from the protruded position y to the retracted position x along with the movement of the slider 23, as shown in FIG. 7.

The integrally rotatable member 21, the relatively rotatable member 22, the slider 23, the oblique groove 2h, the support body 24, the guide members 25 and the rollers 26 may together form a transfer assembly.

In the embodiment shown in FIGS. 7 and 8, the integrally rotatable member 21 is biased in the reverse rotation direction with respect to the relatively rotatable member 22 by the biasing member 28. It should be noted here that, in FIG. 8, illustration of the lifting pins P and a part of the integrally rotatable member 21 are omitted for the sake of ease of understanding.

Based on the above configuration, when the rotation mechanism 10 rotates the integrally rotatable member 21 against the biasing force of the biasing members 28 in the forward direction together with the substrate holder 3, each of the lifting pins P is moved from the retracted position x to the protruded position y. On the other hand, when the driving force from the rotation mechanism 10 is shut off or weakened, the integrally rotatable member 21 is rotated in the reverse direction by the biasing force of the biasing members 28, so that each of the lifting pins P is moved from the protruded position y to the retracted position x.

Next, the transmission state switch 30 will be described.

Figure 9:
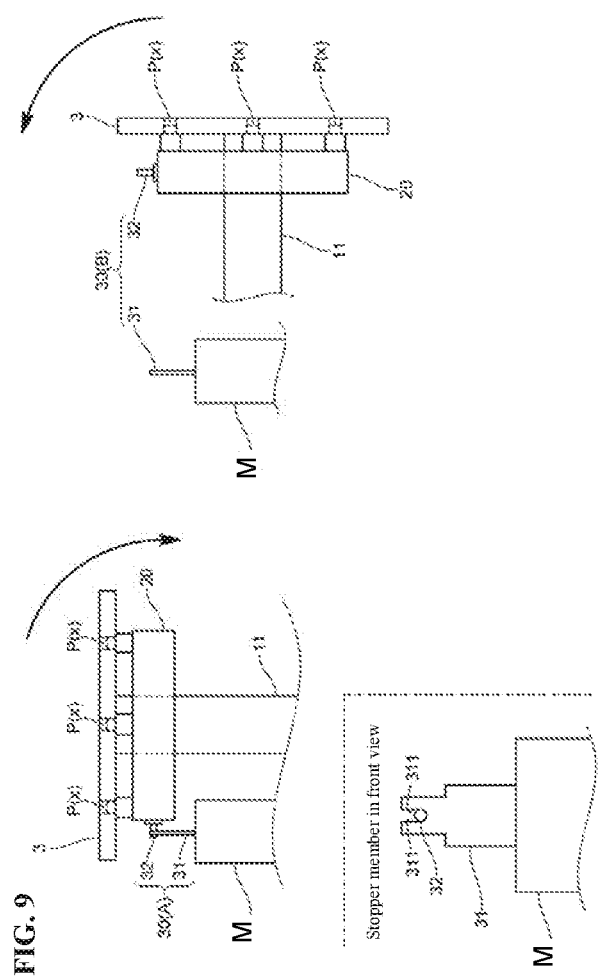
FIG. 9 is a schematic diagram showing an operation of a transmission state switch in the substrate holding device of FIG. 2, according to an embodiment.

FIG. 9 is a schematic diagram showing an operation of a transmission state switch in the substrate holding device of FIG. 2, according to an embodiment.

As shown in FIG. 9, the transmission state switch 30 is configured to switch between the transmittable state A capable of enabling the driving force transmission to the lifting pins P by the driving force transmission assembly 20, and the non-transmittable state B capable of disabling the driving force transmission to the lifting pins P by the driving force transmission assembly 20.

More specifically, the transmission state switch 30 is configured to be set in the transmittable state A when the substrate holder 3 is in the lying posture. In the transmittable state A, a rotational driving force from the rotation mechanism 10 is converted into a driving force for movement of the lifting pins P, and transmitted to the lifting pins P.

Further, the transmission state switch 30 is configured to be set in the non-transmittable state B when the substrate holder 3 is in the standing posture. In the non-transmittable state B, the driving force transmission to the lifting pins P is cut off.

Specifically, as shown in FIGS. 3, 4, 6 and 9, the transmission state switch 30 comprises a stopper 31 for stopping the rotation of the relatively rotatable member 22, and a contact member 32 provided on the relatively rotatable member 22 and configured to be brought into contact with the stopper 31.

As shown in FIG. 9, the stopper 31 has a pair of mutually-opposed stopper surfaces 311 such that when the contact member 32 is located between the mutually-opposed surfaces 311 of the stopper 31, the surfaces 311 prevent the forward and reverse rotations of the relatively rotatable member 22. In the embodiment shown in FIG. 9, the stopper 31 is provided on a member M which is kept in a stationary state, irrespective of the rotation of the substrate holder 3, and formed to have a U-shaped portion opened upwardly. However, the configuration shown in FIG. 9 is only an example, and in some embodiments, the shape of the stopper 31 may be variously changed.

As shown in FIGS. 3, 4 and 6, the contact member 32 is formed to protrude radially outwardly from the outer peripheral surface of the relatively rotatable member 22, and, after penetrating through a through-window 3w provided in a peripheral wall of the integrally rotatable member 21, protrudes radially outwardly from an outer peripheral surface of the integrally rotatable member 21. The through-window 3w is formed in an elongate hole-like shape having a width along the circumferential direction.

As shown in FIG. 9, the contact member 32 is configured to be brought into contact with the pair of mutually-opposed stopper surfaces 311 of the stopper 31 when the contact member 32 is received in a space defined between the stopper surfaces 311. More specifically, when the aforementioned loading angle adjustment mechanism moves the substrate holder 3 from the standing posture to the lying posture, the contact member 32 is dropped into the space between the pair of surfaces 311 from above the stopper 31.

A state in which the substrate holder 3 is set in the lying posture, and the contact member 32 is dropped into the space between the pair of stopper surfaces 311 and brought into contact with the stopper 31 in the above manner is the transmittable state A. In the transmittable state A, the relatively rotatable member 22 is restricted in terms of rotation and thereby fixed. Therefore, when rotating the integrally rotatable member 21, the integrally rotatable member 21 is relatively rotated with respect to the relatively rotatable member 22, so that the slider 23 is slid along the inside of the oblique groove 2h to move the lifting pin P up and down, as mentioned above.

On the other hand, a state in which the substrate holder 3 is set in the standing posture and the contact member 32 is brought out of contact with the stopper 31 is the non-transmittable state B. In the non-transmittable state B, the relatively rotatable member 22 is permitted to rotate, and thereby rotated integrally with the integrally rotatable member 21. Therefore, even when rotating the integrally rotatable member 21, the slider 23 is not slid along the inside of the oblique groove 2h, so that the lifting pin P is not moved up and down.

Next, a controller C (see FIG. 1) for controlling the transfer arm 4 and the rotation mechanism 10 will be described.

Figure 10:
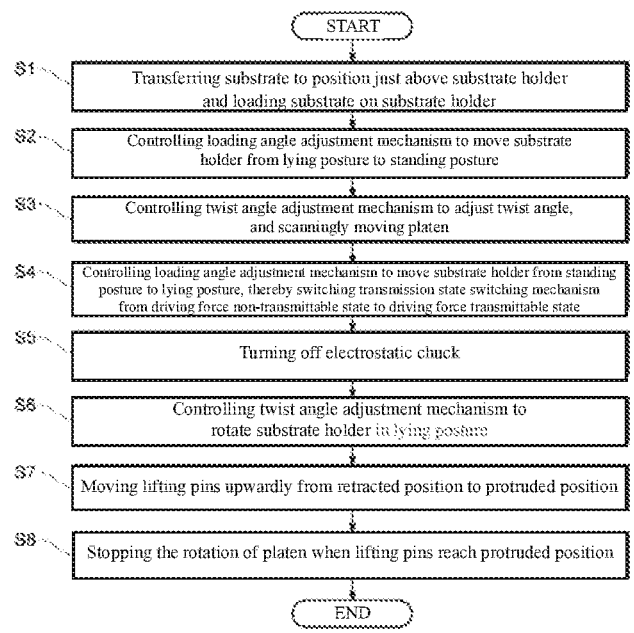
FIG. 10 is a flowchart showing an operation of a controller in the substrate holding device of FIG. 1, according to an embodiment.

FIG. 10 is a flowchart showing an operation of a controller in the substrate holding device of FIG. 1, according to an embodiment.

The controller C comprises a central processing unit (CPU), a memory, a display and input means, and configured to execute the following control according to program code stored in the memory.

The controller C operates to control the transfer arm 4 to transfer the substrate W to a position just above the substrate holder 3 in the lying posture and place or load the substrate W on the substrate holder 3 (S1).

Subsequently, the controller C operates to instruct an electrostatic chuck to hold the substrate W loaded on the substrate holder 3, and then control the loading angle adjustment mechanism to turn the substrate holder 3 from the lying posture to the standing posture (S2).

Subsequently, during irradiation with an ion beam, the controller C operates to control the rotation angle adjustment mechanism to rotate the substrate holder 3 about an axis orthogonal to the substrate W in the standing posture to set an angle between a crystal axis of the substrate W and an irradiation direction of the ion beam to a given value, and then scanningly move the substrate holder 3 along a given direction (S3).

During this process, the substrate holder 3 is in the standing posture, and thus the transmission state switch 30 is in the non-transmittable state B, so that the substrate holder 3, the integrally rotatable member 21 and the relatively rotatable member 22 are integrally rotated, in a situation where a rotational driving force from the rotation angle adjustment mechanism is not transmitted to the lifting pins P.

Upon completion of the irradiation of the substrate W with the ion beam, the controller C operates to control the loading angle adjustment mechanism again to turn the substrate holder 3 from the standing posture to the lying posture. By turning the substrate holder 3 from the standing posture to the lying posture, the contact member 32 is dropped into the space between the pair of stopper surfaces 311, and brought into contact with the stopper 31, so that the transmission state switch 30 is switched from the non-transmittable state B to the transmittable state A (S4).

Subsequently, the controller C operates to turn off the electrostatic chuck of the substrate holder 3 (S5).

Subsequently, the controller C operates to control the rotation angle adjustment mechanism serving as the rotation mechanism 10 again to rotate the substrate holder 3 in the lying posture, in the forward direction about the axis orthogonal to the substrate W (S6).

During this process, the relatively rotatable member 22 is fixed, so that the integrally rotatable member 21 is relatively rotated with respect to the relatively rotatable member 22, and thereby the slider 23 is moved from the second horizontal end portion 2hc to ascend the inclined portion 2ha and reach the first horizontal end portion 2hb. Thus, each of the lifting pins P is moved from the retracted position x to the protruded position y along with the movement of a corresponding one of the sliders 23, and the substrate W is lifted by the lifting pins P (S7).

In the embodiment shown in FIG. 7, the driving force transmission assembly 20 is configured such that, when the lifting pin P reaches the protruded position y, the slider 23 is not brought into contact with an inner surface of a terminal end of the second horizontal end portion 2hc of the oblique groove 2h, as shown in FIG. 7. That is, the lifting pins P reach the fully protruded position y before the sliders 23 are brought into contact with a terminal end of the second horizontal end portion 2hc of the oblique groove 2h. In other words, the second horizontal end portion 2hc is configured to have a length enabling the slider 23 to keep a non-contact state with the inner surface of the terminal end of the second horizontal end portion 2hc when the lifting pin P is located at the protruded position y, Similarly, the first horizontal end portion 2hb is configured such that the slider 23 is kept in a non-contact state with an inner surface of a terminal end of the first horizontal end portion 2hb when the lifting pin P is located at the retracted position x.

In the embodiment shown in FIG. 7, the controller C is configured to stop the upward movement of the lifting pins P by stopping the rotation of the rotation mechanism 10 at the time when the lifting pins P reach the protruded position y after being moved from the retracted position x, instead of the upward movement of the lifting pins P being mechanically stopped by the oblique groove 2h.

More specifically, as shown in FIGS. 3 and 4, an arm portion 5 is provided on the outer peripheral surface of the integrally rotatable member 21 to protrude radially outwardly, and a position sensor 6 such as an infrared sensor for detecting the position of the arm portion 5 is provided on the member M which is kept in a stationary state, irrespective of the rotation of the integrally rotatable member 21. In some embodiments, the arm portion 5 may have an L-shape as shown in FIGS. 3 and 4.

The arm portion 5 and the position sensor 6 are arranged such that the arm portion 5 is detected by the position sensor 6 when the lifting pins P reach the protruded position y after being moved from the retracted position x.

The controller C is operable, when the lifting pins P reach the protruded position y, and thus the position sensor 6 detects the arm portion 5, to stop the rotation of the rotation mechanism 10 (S8).

The above are the details of control of moving the lifting pins P from the retracted position x to the protruded position y.

In this embodiment, the controller C is configured to, during the control processing in the S6, i.e., when controlling the rotation angle adjustment mechanism to rotate the substrate holder 3 in the lying posture, in the forward direction, control the tilt angle adjustment mechanism to rotate the substrate holder 3 in the lying posture, in the reverse direction.

Specifically, when the substrate holder 3 is in the lying posture, the rotational axis of the substrate holder 3 when rotated by the rotation angle adjustment mechanism, and the rotational axis of the substrate holder 3 when rotated by the tilt angle adjustment mechanism, are located coaxially, and the rotation angle adjustment mechanism and the tilt angle adjustment mechanism operate to rotate the substrate holder 3, respectively, in opposite directions at the same angular speed. Thus, by activating both the rotation angle adjustment mechanism and the tilt angle adjustment mechanism, the substrate holder 3 and the substrate W loaded on the substrate holder 3 becomes a non-rotated state.

Further, the controller C is configured to, during the control processing in the S7, i.e., when the lifting pins P are moved upwardly from the retracted position x, insert the transfer arm 4 beneath an outer periphery of the substrate W loaded on the substrate holder 3 and move the transfer arm 4 upwardly.

In this case, the controller C operates to control the substrate holding device 200 and the transfer arm 4 such that the lifting pins P and the transfer arm 4 simultaneously lift the substrate W. The term "simultaneously lift" here does not necessarily mean that a timing when each of the lifting pins P is moved upwardly and brought into contact with the substrate W is coincident with a timing when the transfer arm 4 is brought into contact with the lifted substrate W, but includes a case where one of the lifting pin P and the transfer arm 4 is brought into contact with the substrate W, and then the other is brought into contact with the substrate W.

When lifting the substrate W by the transfer arm 4, the substrate W is set in the non-rotated state, as mentioned above. This makes it possible to prevent the transfer arm 4 from scraping against a back surface of the substrate W, thereby suppressing generation of particles, damage of the substrate W, and the like.

In this way, the substrate W is pushed upwardly by the lifting pins P and simultaneously lifted by the transfer arm 4, and separated from the substrate holder 3.

In the substrate holding device 200 according to the above embodiments, the rotation angle adjustment mechanism is used as the rotation mechanism 10, and the rotational driving force from the rotation mechanism 10 is converted into a driving force for moving the lifting pins P up and down and transmitted to the lifting pins P, through the driving force transmission assembly 20, so that it is possible to lift the substrate W at a plurality of points by the lifting pins P, without using a dedicated driving source such as a separate electric motor for moving the lifting pins P up and down.

This makes it possible to lift the substrate W from the substrate holder 3 without causing increases in size and cost of the entire device.

In the above embodiments, the transmission state switch 30 is configured to switch between the transmittable state A and the non-transmittable state B. Thus, it is possible to, when separating the substrate W from the substrate holder 3, enable the driving force transmission to the lifting pins P by the driving force transmission assembly 20, and, when irradiating the substrate W with the ion beam IB, perform the substrate treatment, without transmitting any driving force to the lifting pins P.

In the above embodiments, the lifting pins P and the transfer arm 4 simultaneously lift the substrate W. Thus, the lifting of the substrate W by the transfer arm 4 may be assisted by the lifting pins P, so that it is possible to lift the substrate W from the substrate holder 3 in a more stable posture.

In the above embodiments, when the lifting pins P reach the protruded position y after being moved from the retracted position x, and the position sensor 6 detects the arm portion 5, the rotation angle adjustment mechanism is stopped such that the substrate holder 3 does not rotate.

Thus, as compared with the case of mechanically stopping the rotation of the substrate holder 3, the slider 23 becomes less likely to be brought into contact with the inner surface of the terminal end of the oblique groove 2h, so that it is possible to suppress generation of particles and improve durability of the slider 23.

It should be understood that the present disclosure is not limited to the above embodiments.

For example, in the above embodiments, the rotation mechanism 10 is constructed using the rotation angle adjustment mechanism as the second rotation/revolution mechanism. Alternatively, the rotation mechanism 10 may be constructed using the tilt angle adjustment mechanism as the third rotation/revolution mechanism.

In the above embodiments, the controller C is configured to control the lifting pins P and the transfer arm 4 such that the lifting pins P and the transfer arm 4 simultaneously lift the substrate W. Alternatively, the controller C may be configured to control the lifting pins P to reach the protruded position y after being moved from the retracted position x, i.e., control the lifting pins P to separate the substrate W from the substrate holder 3, and then control the transfer arm 4 to further lift the substrate W.

In the above embodiments, the oblique groove 2h is formed in the outer peripheral surface of the relatively rotatable member 22, and the guide members 25 are provided on the integrally rotatable member 21. Alternatively, the oblique groove 2h may be formed in an inner peripheral surface of the integrally rotatable member 21, and the guide members 25 may be provided on the relatively rotatable member 22.

In the above embodiments, the size of the substrate W is greater than the size of the surface 3a of the substrate holder 3. Alternatively, the size of the substrate W may be equal to or less than the size of the substrate loading surface 3a of the substrate holder 3.

In this case, the controller C may be configured to control the lifting pins P to lift the substrate W, and then control the transfer arm 4 to be inserted beneath the outer periphery of the substrate W so as lift the substrate W to separate the substrate W from the substrate holder 3.

Further, each of the lifting pins P need not necessarily be configured to be moved up and down through a corresponding one of the through-holes 3h formed in the substrate holder 3. However, this is only an example, and in some embodiments, the lifting pins P may be provided in a region outside the substrate holder 3 such that the lifting pins P may be configured to be moved between a retracted position x where the lifting pins are located below the surface 3a and a protruded position y where the lifting pins are located to protrude upwardly from the substrate loading surface 3a, in the region outside the substrate holder 3.

It should be understood that the present disclosure is not limited to the above embodiment and modifications, but various other changes and modifications may be made therein without departing from the spirit and scope of the present inventive concept as set forth in appended claims.

What is claimed is:

1. A substrate holding device comprising:
    a substrate holder;
    a rotator that rotates the substrate holder;
    a plurality of lifting pins configured to be moved between
        a retracted position in which the plurality of lifting pins are below a surface of the substrate holder, and a protruded position in which the plurality of lifting pins protrude from the surface; and
    a driving force transmitter that:
        is interposed between the rotator and the plurality of lifting pins,
        converts an initial driving force, which is imposed by the rotator and which rotates the substrate holder, into a converted driving force that moves the plurality of lifting pins between the retracted position and the protruded position, and
        transmits the converted driving force to the plurality of lifting pins,
    wherein the driving force transmitter comprises:
        an integrally rotatable member attached to the substrate holder and rotatable together with the substrate holder;
        a relatively rotatable member that is coaxial with the integrally rotatable member and rotatable relative to the integrally rotatable member;
        a plurality of oblique grooves provided in one of the integrally rotatable member and the relatively rotatable member;
        a plurality of pairs of guide members provided on the other of the integrally rotatable member and the relatively rotatable member; and
        a plurality of support bodies, each support body engaged with one of the lifting pins, slidable along a respective pair of the guide members, and comprising a slider slideable along the oblique groove;
    wherein the substrate holder is configured to be movable between a lying posture and a standing posture and, while the substrate holder is in the lying posture, the relatively rotatable member is rotationally restricted such that the integrally rotatable member is rotated with respect to the relatively rotatable member, and the plurality of lifting pins are moved in conjunction with the integrally rotatable member, and
    wherein the substrate holding device further comprises a transmission state switch configured to switch between a transmittable state that enables transmission of the converted driving force to the plurality of lifting pins by the driving force transmitter, and a non-transmittable state that disables the transmission of the converted driving force to the plurality of lifting pins by the driving force transmitter,
    wherein:
        the transmission state switch switches from the transmittable state to the non-transmittable state when the substrate holder is moved from the lying posture to the standing posture, and
        the transmission state switch switches from the non-transmittable state to the transmittable state when the substrate holder is moved from the standing posture to the lying posture.

2. The substrate holding device as recited in claim 1, wherein the rotator comprises a shaft and a motor attached to the shaft.

3. The substrate holding device as recited in claim 1, further comprising a stopper including a pair of mutually opposed surfaces, and a contact member located between the pair of mutually opposed surfaces of the stopper, wherein the restriction of the relatively rotatable member is performed by the stopper and the contact member.

4. A substrate holding device comprising:
    a substrate holder;
    a shaft attached to the substrate holder;
    a motor configured to rotate the shaft via an initial driving force;

a plurality of lifting pins moveable between a retracted position below a surface of the substrate holder, and a protruded position protruding from the surface; and a switch provided between the shaft and the plurality of lifting pins that switches the substrate holding device between a transmittable state in which the initial driving force from the motor is converted into a converted driving force and transmitted to the lifting pins such that the converted driving force moves the lifting pins between the retracted position and the protruded position, and a non-transmittable state in which the initial driving force from the motor is not transmitted to the lifting pins but rotates the substrate holder, wherein the switch comprises:

a first annular member attached to the substrate holder and rotatable together with the substrate holder, and a second annular member that is coaxial with the first annular member, attached to the first annular member by a plurality of springs, and rotatable relative to the first annular member, and wherein while the substrate holder is in the transmittable state, the second annular member is restricted such that the first annular member is rotated with respect to the second annular member, and the plurality of lifting pins are moved in conjunction with the first annular member.

5. The substrate holding device as recited in claim 4, wherein the switch comprises:

a plurality of grooves provided in the second annular member;

a plurality of pairs of guides provided on the first annular member; and a plurality of support bodies, each support body engaged with one of the lifting pins, slidable along a respective pair of the guides, and comprising a slider, a portion of which extends into a respective one of the grooves to be slideable along the groove.

6. The substrate holding device as recited in claim 4, wherein the switch comprises:

a plurality of grooves provided in the first annular member;

a plurality of pairs of guides provided on the second annular member; and a plurality of support bodies, each support body engaged with one of the lifting pins, slidable along a respective pair of the guides, and comprising a slider, a portion of which extends into a respective one of the grooves to be slideable along the groove.

7. The substrate holding device as recited in claim 4, further comprising a stopper including a pair of mutually opposed surfaces, and a contact member located between the pair of mutually opposed surfaces of the stopper, wherein the restriction of the second annular member is performed by the stopper and the contact member.

* * * * *